(12) United States Patent
Bergk

(10) Patent No.: US 7,397,679 B2
(45) Date of Patent: Jul. 8, 2008

(54) INDUCTIVE TRANSMISSION OF ELECTRIC ENERGY

(75) Inventor: Günther Bergk, Niedernhausen (DE)

(73) Assignee: Braun GmbH, Kronberg (DE)

( * ) Notice: Subject to any disclaimer, the term of this patent is extended or adjusted under 35 U.S.C. 154(b) by 171 days.

(21) Appl. No.: 10/566,687

(22) PCT Filed: Jul. 13, 2004

(86) PCT No.: PCT/EP2004/007695

§ 371 (c)(1),
(2), (4) Date: Jan. 31, 2006

(87) PCT Pub. No.: WO2005/018079

PCT Pub. Date: Feb. 24, 2005

(65) Prior Publication Data

US 2006/0214741 A1 Sep. 28, 2006

(30) Foreign Application Priority Data

Aug. 8, 2003 (DE) ................. 103 36 435

(51) Int. Cl.
*H02M 7/537* (2006.01)
(52) U.S. Cl. .................. 363/131; 315/224; 315/307
(58) Field of Classification Search ......... 363/131–134, 363/49, 91, 25, 78, 41, 50–58, 86.89, 95; 315/224, 247, 307, 260, 205, 219; 307/252, 307/255; 323/267, 289, 265, 266

See application file for complete search history.

(56) References Cited

U.S. PATENT DOCUMENTS

| | | | |
|---|---|---|---|
| 3,962,626 A | | 6/1976 | Cardwell |
| 4,286,316 A | * | 8/1981 | Friend .................. 363/131 |
| 4,614,897 A | * | 9/1986 | Kumbatovic ............ 315/224 |
| 5,062,031 A | | 10/1991 | Flachenecker et al. |
| 6,218,788 B1 | | 4/2001 | Chen et al. |
| 6,345,203 B1 | | 2/2002 | Mueller et al. |

FOREIGN PATENT DOCUMENTS

| | | |
|---|---|---|
| DE | 1 438 457 | 10/1968 |
| DE | 31 01 460 | 12/1981 |
| DE | 38 42 465 | 6/1990 |
| DE | 40 15 455 | 11/1991 |
| EP | 0 473 957 | 8/1991 |

* cited by examiner

*Primary Examiner*—Rajnikant B Patel
(74) *Attorney, Agent, or Firm*—Fish & Richardson P.C.

(57) ABSTRACT

An inductive electric energy transmission circuit includes: an oscillating circuit; a push-pull circuit including a first switching transistor and a second switching transistor that are configured to alternate a current flow through the oscillating circuit. The circuit arrangement also includes, a control circuit including first and second control transistors configured to control the first and second switching transistors; and a frequency generator configured to generate an output signal, wherein the output signal is adapted to drive the control transistors.

21 Claims, 1 Drawing Sheet

INDUCTIVE TRANSMISSION OF ELECTRIC ENERGY

TECHNICAL FIELD

This disclosure relates to inductive transmission of electric energy, for example, a circuit arrangement for supplying an electrical appliance with power and/or for inductively charging a battery.

BACKGROUND

Devices for transmitting electric energy, such as electrical circuits, are known in the art. For example, DE 38 42 465 A1 discloses a switching controller for a d.c.-d.c. conversion which comprises an electronic switch and a series-resonant circuit (rather than an inductor). The switching controller oscillates with the resonant frequency of the series-resonant circuit and therefore has a particularly high efficiency if the electronic switch switches in the zero crossings of the current. The electronic switch is realized with two complimentary switching transistors that are controlled in antiphase. The control of the switching transistors is realized with a feedback circuit and input stages for the switching transistors that are not described in detail.

As another example, DE 40 15 455 A1 discloses a control circuit for an inverted rectifier that comprises a push-pull output stage with complementary transistors. The control of the transistors is realized with two electrically coupled control signals of mutually shifted potential. The connecting and disconnecting control signal edges are shifted by means of a delay circuit such that the initially switched-on transistor is switched off before the still switched-off transistor is switched on. This results in a relatively complex control circuit.

SUMMARY

According to one aspect, an inductive electric energy transmission circuit includes: an oscillating circuit; a push-pull circuit including a first switching transistor and a second switching transistor that are configured to alternate a current flow through the oscillating circuit. The circuit arrangement also includes a control circuit including first and second control transistors configured to control the first and second switching transistors; and a frequency generator configured to generate an output signal adapted to drive the control transistors. With a low circuit expenditure, a high efficiency circuit arrangement for transmission of electric energy can be made available.

In some cases, the oscillating circuit is configured to oscillate at an oscillatory frequency substantially equal to a frequency of the output signal of the frequency generator.

In some cases, the output signal of the frequency generator includes a square-wave signal, i.e., if the frequency generator delivers a square-wave output signal.

In some embodiments, a control terminal of the first control transistor and a control terminal of the second control transistor are configured to receive the output signal from the frequency generator. Preferably, a control terminal of the first switching transistor is electrically connected to a first end of a resistor, and a control terminal of the second switching transistor is connected to a second end of the resistor.

In some implementations, a first capacitor is arranged electrically parallel to a main current path of the first control transistor, wherein a first end of the capacitor is electrically connected to the first end of the resistor; and a second capacitor is arranged electrically parallel to a main current path of the second control transistor, wherein a first end of the second capacitor is electrically connected to the second end of the resistor. Preferably, the first capacitor, the resistor, and the second capacitor form a series connection, wherein a supply voltage source is connected in parallel with the series connection. Due to these measures, one switching transistor can be switched off faster than the other switching transistor is switched on, thereby preventing the supply voltage source from being quasi short-circuited as a result of the first and second switching transistors being simultaneously switched on.

In some examples, the oscillating circuit includes an inductive coil. In this case, the inductive coil may form a primary coil of a transformer. Preferably, the primary coil can supply electric energy to a secondary coil of the transformer. The circuit arrangement can be used, for example, for supplying electric energy to a small electrical appliance that contains the secondary coil, preferably electric toothbrushes or electric razors that may also contain a battery.

One embodiment of a circuit arrangement configured for the inductive transmission of electric energy is illustrated in FIG. 1. Other embodiments are discussed in the following description.

DETAILED DESCRIPTION

Figure 1:
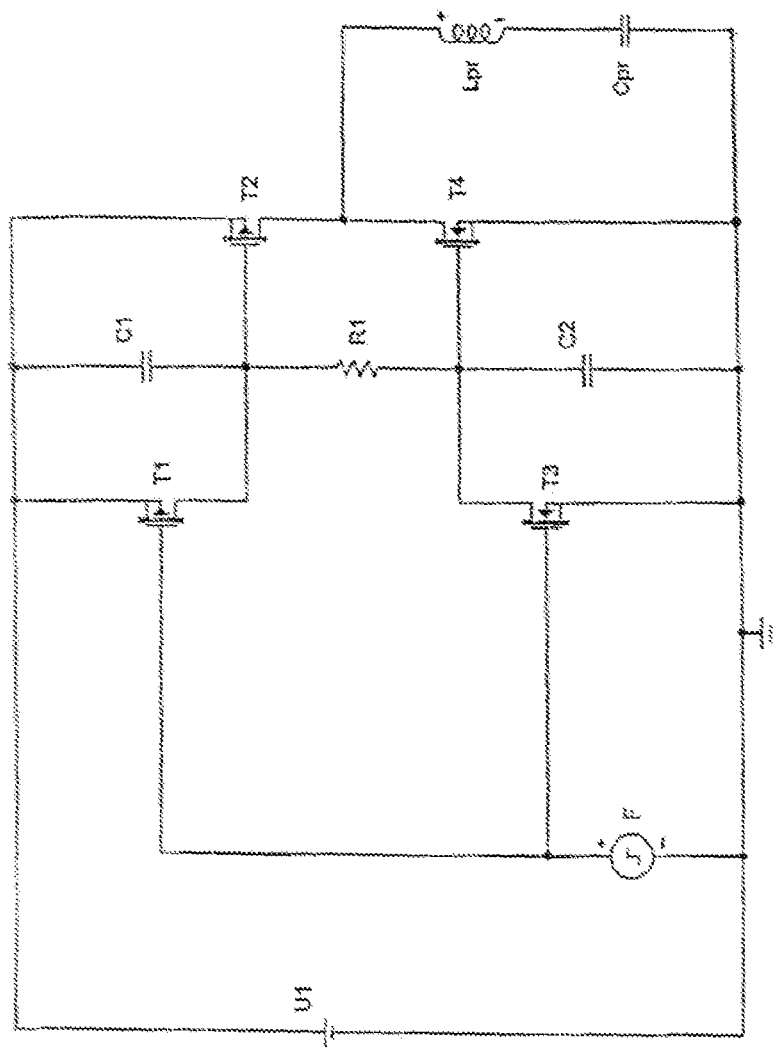
FIG. 1 is a schematic diagram of circuit arrangement configured to inductively transmit electric energy.

The circuit arrangement illustrated in FIG. 1 includes two switching transistors in the form of complimentary field effect transistors (e.g., first switching transistor T2, and second switching transistor T4), the drain terminals of the first switching transistor T2 and second switching transistor T4 are connected to one another and to one end of an oscillating circuit including an inductor Lpr and a capacitor Cpr. The other end of the oscillating circuit and the source terminal of the n-channel field effect transistor (i.e., second switching transistor T4 are connected to ground. The source terminal of the p-channel field effect transistor (i.e., first switching transistor T2) is connected to the plus pole of a supply voltage source U1. The minus pole of the supply voltage source U1 is connected to ground. The circuit arrangement includes two additional control transistors in the form of complimentary field effect transistors (e.g., first control transistor T1, and second control transistor T3), the gate terminals of the first control transistor T1 and the second control transistor T3 are directly connected to the input of a frequency generator F that generates an output signal referred to ground. The gate terminals of the first and second switching transistors T2, T4 are connected by means of a resistor R1. One end of the resistor R1 is connected to the drain terminal of the p-channel field effect transistor (i.e., the first control transistor T1), as well as to the plus pole of the supply voltage source U1 by means of the first capacitor C1. The other end of the resistor R1 is connected to the drain terminal of the n-channel field effect transistor (i.e., the second control transistor T3), as well as to ground by means of a second capacitor C2. The source terminal of the first control transistor T1 is connected to the plus pole of the supply voltage source U1. The minus pole of the supply voltage source U1 is connected to the source terminal of the second control transistor T3.

In another embodiment, the first and second switching transistor T2, T4 and/or the first and second control transistors T1, T3 can be complimentary bipolar transistors.

In another embodiment, the polarities of the supply voltage source and the transistors (i.e., the first and second switching transistors and the first and second control transistors) are reversed.

Other variations of the above-described embodiments lack the first and second capacitors C1 and C2, i.e., the function of these capacitors is respectively fulfilled by the gate-source capacitance and the base-emitter capacitance of the first and second switching transistors T2, T4.

The function of the circuit arrangement illustrated in FIG. 1 is described below. The first and second switching transistors T2, T4 are wired in the form of a push-pull stage and alternately connect the oscillating circuit to the operating voltage and to ground, wherein the push-pull stage is controlled with square-wave signals by the first and second control transistors T1, T3. The first and second capacitors C1, C2 and the resistor R1 are provided in order to prevent that the switching transistors T2, T4 from simultaneously carrying a high drain current. For example, if the output signal of the frequency generator F is positive, i.e., if it approximately assumes the operating voltage, the second control transistor T3 is conductive and the first control transistor T1 is non-conductive. Consequently, the first switching transistor T2 is conductive and the second switching transistor T4 is non-conductive. When the output signal of the frequency generator F changes to ground, i.e., the reference potential, the first control transistor T1 and the second switching transistor T4 become conductive while the second control transistor T3 and the first switching transistor T2 become non-conductive. This causes the gate-source voltage of the first switching transistor T2 to drop with a time constant R'C', wherein R' refers to the track resistance of the now conductive first control transistor T1 and C' refers to the sum of the capacitance of the first capacitor C1 and the input capacitance of the first switching transistor T2. The gate-source voltage of the second switching transistor T4 simultaneously increases with a time constant R"C", wherein R" refers to the sum of the resistance of the resistor R1 and the track resistance of the now conductive first control transistor T1 and C" refers to the sum of the capacitance of the second capacitor C2 and the input capacitance of the switching transistor T4. Assuming that C' is practically equal to C", R'C' is much shorter than R"C" because the resistance R' is much lower than the resistance R", i.e. the switching transistor T2 is switched off faster than the switching transistor T4 is switched on. If the first and second capacitors C1, C2, the input capacitances of the first and second switching transistors T2, T4 and the track resistances of the first and second control transistors T1, T3 are approximately equal, one switching transistor consequently is always switched off faster than the other switching transistor is switched on. The time delay between switching on and switching off can be adapted to the switching and delay times of the first and second switching transistors T2, T4 by choosing the ratings of the first and second capacitors C1, C2 and of the resistor R1 accordingly.

The invention claimed is:

1. An inductive electric energy transmission circuit comprising:
    an oscillating circuit;
    a push-pull circuit comprising first and second switching transistors configured to alternate a flow of current through the oscillating circuit;
    a control circuit comprising first and second control transistors configured to control the first and second switching transistors;
    a frequency generator configured to generate an output signal adapted to drive the control transistors;
    a first capacitor arranged electrically parallel to a main current path of the first control transistor, wherein a first end of the first capacitor is electrically connected to a first end of a resistor; and
    a second capacitor arranged electrically parallel to a main current path of the second control transistor, wherein a first end of the second capacitor is electrically connected to the second end of the resistor.

2. The inductive electric energy transmission circuit according to claim 1, wherein the oscillating circuit is configured to oscillate at an oscillatory frequency substantially equal to a frequency of the output signal of the frequency generator.

3. The inductive electric energy transmission circuit according to claim 1, wherein the output signal of the frequency generator comprises a square-wave signal.

4. The inductive electric energy transmission circuit according to claim 1, wherein a control terminal of the first control transistor and a control terminal of the second control transistor are configured to receive the output signal from the frequency generator.

5. The inductive electric energy transmission circuit according to claim 4, wherein a control terminal of the first switching transistor is electrically connected to a first end of a resistor, and wherein a control terminal of the second switching transistor is electrically connected to a second end of the resistor.

6. The inductive electric energy transmission circuit according to claim 1 wherein the first capacitor, the resistor, and the second capacitor form a series connection,
    the circuit further comprising a supply voltage source connected in parallel with the series connection.

7. The inductive electric energy transmission circuit according to claim 1, wherein a main current path of the first switching transistor and a main current path of the second switching transistor are arranged in a series connection, and wherein a supply voltage source is connected in parallel to the series connection.

8. The inductive electric energy transmission circuit according to claim 1, wherein the oscillating circuit comprises an inductive coil.

9. The inductive electric energy transmission circuit according to claim 8, wherein the inductive coil is a primary coil of a transformer, and wherein the primary coil is configured to supply electric energy to a secondary coil of the transformer.

10. The inductive electric energy transmission circuit according to claim 1, wherein one of the first control transistor and the second control transistor is an n-channel field effect transistor, and wherein the other one of the first control transistor and the second control transistor is a p-channel field effect transistor.

11. The inductive electric energy transmission circuit according to claim 1, wherein one of the first switching transistor and the second switching transistor is an n-channel field effect transistor, and wherein the other one of the first switching transistor and the second switching transistor is a p-channel field effect transistor.

12. The inductive electric energy transmission circuit according to claim 1, wherein the first control transistor and the second control transistor comprise bipolar transistors having opposite polarity.

13. The inductive electric energy transmission circuit according to claim 1, wherein the first switching transistor and the second switching transistor comprise bipolar transistors having opposite polarity.

14. A method of inductively transmitting electric energy, the method comprising:
   providing a circuit arrangement including:
      an oscillating circuit;
      a push-pull circuit comprising first and second switching transistors configured to alternate a first current flow through the oscillating circuit;
      a control circuit comprising first and second control transistors configured to control an antiphase switching of the first and second switching transistors;
      a frequency generator;
      a first capacitor arranged electrically parallel to a main current path of the first control transistor, wherein a first end of the first capacitor is electrically connected to a first end of a resistor; and
      a second capacitor arranged electrically parallel to a main current path of the second control transistor, wherein a first end of the second capacitor is electrically connected to the second end of the resistor;
   generating an output signal with the frequency generator; and
   delivering the output signal to a control terminal of the first control transistor and a control terminal of the second control transistor, thereby driving the control circuit and controlling the direction of the first current flow through the oscillating circuit.

15. The method according to claim 14, wherein the oscillating circuit comprises a primary coil of a transformer.

16. The method according to claim 15, further comprising magnetically coupling the primary coil to a secondary coil, and inducing a second current flow through the secondary coil.

17. The method according to claim 16, further comprising connecting the secondary coil to a battery, and charging the battery with the second current flow from the secondary coil.

18. In combination, an electrical appliance and an associated charging station; wherein the charging station comprises:
   a circuit arrangement configured to inductively transmit electric energy, including:
      an oscillating circuit comprising:
         a primary coil of a two-part transformer;
      a push-pull circuit comprising first and second switching transistors configured to alternate a flow of current through the oscillating circuit;
      a control circuit comprising first and second control transistors configured to control the first and second switching transistors;
      a frequency generator configured to generate an output signal adapted to drive the control transistors;
      a first capacitor arranged electrically parallel to a main current path of the first control transistor, wherein a first end of the first capacitor is electrically connected to a first end of a resistor; and
      a second capacitor arranged electrically parallel to a main current path of the second control transistor, wherein a first end of the second capacitor is electrically connected to the second end of the resistor; and
   wherein the electric appliance comprises:
      a secondary coil of the two-part transformer configured to magnetically couple to the primary coil for transmitting electric energy from the primary coil to the secondary coil.

19. The combination according to claim 18, wherein the electric appliance further comprises a battery electrically connected to the secondary coil.

20. The combination according to claim 18, wherein the electric appliance is an electric toothbrush.

21. The combination according to claim 18, wherein the electric appliance is an electric shaver.

* * * * *